(12) United States Patent
Auchere et al.

(10) Patent No.: US 9,402,331 B2
(45) Date of Patent: Jul. 26, 2016

(54) INTEGRATED CIRCUIT CHIP COMPRISING ELECTRONIC DEVICE AND ELECTRONIC SYSTEM

(71) Applicant: STMicroelectronics (Grenoble 2) SAS, Grenoble (FR)

(72) Inventors: David Auchere, St. Martin d'Heres (FR); Yvon Imbs, Quaix en Chartreuse (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/512,214

(22) Filed: Oct. 10, 2014

(65) Prior Publication Data

US 2015/0103489 A1 Apr. 16, 2015

(30) Foreign Application Priority Data

Oct. 15, 2013 (FR) ...................... 13 60008

(51) Int. Cl.
| | |
|---|---|
| *H05K 1/02* | (2006.01) |
| *H05K 1/18* | (2006.01) |
| *H05K 1/11* | (2006.01) |
| *H05K 7/20* | (2006.01) |
| *H05K 1/14* | (2006.01) |
| *H01L 23/473* | (2006.01) |
| *H01L 23/498* | (2006.01) |
| *H01L 25/10* | (2006.01) |

(52) U.S. Cl.
CPC ................ *H05K 7/20* (2013.01); *H01L 23/473* (2013.01); *H01L 23/49816* (2013.01); *H01L 25/105* (2013.01); *H05K 1/0201* (2013.01); *H05K 1/0203* (2013.01); *H05K 1/111* (2013.01); *H05K 1/14* (2013.01); *H05K 1/181* (2013.01); *H01L 2224/73204* (2013.01); *H05K 2201/064* (2013.01)

(58) Field of Classification Search
CPC .......... H05K 7/20; H05K 1/111; H05K 1/14; H05K 2201/064; H05K 1/0201; H05K 1/0203; H05K 1/18; H05K 1/181; H01L 23/473; H01L 23/49816; H01L 25/105; H01L 2224/73204
USPC .......... 174/250–268; 361/760, 704–720, 688, 361/772, 777, 677, 689; 257/678, 712, 714
See application file for complete search history.

(56) References Cited

U.S. PATENT DOCUMENTS 6,670,699 B2 * 12/2003 Mikubo ................ H01L 23/433
257/678
6,903,929 B2 * 6/2005 Prasher ............... H01L 23/4006
165/80.4

(Continued)

FOREIGN PATENT DOCUMENTS

DE 102007036268 A1 2/2008

OTHER PUBLICATIONS

INPI Search Report and Written Opinion for FR 1360008 dated May 26, 2014 (7 pages).

*Primary Examiner* — Ishwarbhai B Patel
(74) *Attorney, Agent, or Firm* — Gardere Wynne Sewell LLP

(57) ABSTRACT

An electronic device includes a substrate wafer made of an insulating material and having an electrical connection network. An integrated circuit chip is mounted to a top side of the substrate wafer. The substrate wafer contains an internal duct. The duct is formed by a covered trench located in the top side of the substrate wafer. The trench contains a thermally conductive material, for example being a fluid. Openings in the top side of the substrate wafer that are offset from the trench permit the making of an electrical connection between the integrated circuit and the electrical connection network.

18 Claims, 3 Drawing Sheets

(56) References Cited

U.S. PATENT DOCUMENTS

| | | | |
|---|---|---|---|
| 7,727,807 B2 * | 6/2010 | Han | H01L 23/427 257/E25.027 |
| 7,990,711 B1 | 8/2011 | Andry et al. | |
| 8,563,365 B2 * | 10/2013 | King, Jr. | H01L 23/473 257/713 |
| 2002/0185718 A1 | 12/2002 | Mikubo et al. | |
| 2010/0187683 A1 | 7/2010 | Bakir et al. | |
| 2012/0228779 A1 | 9/2012 | King, Jr. et al. | |

* cited by examiner

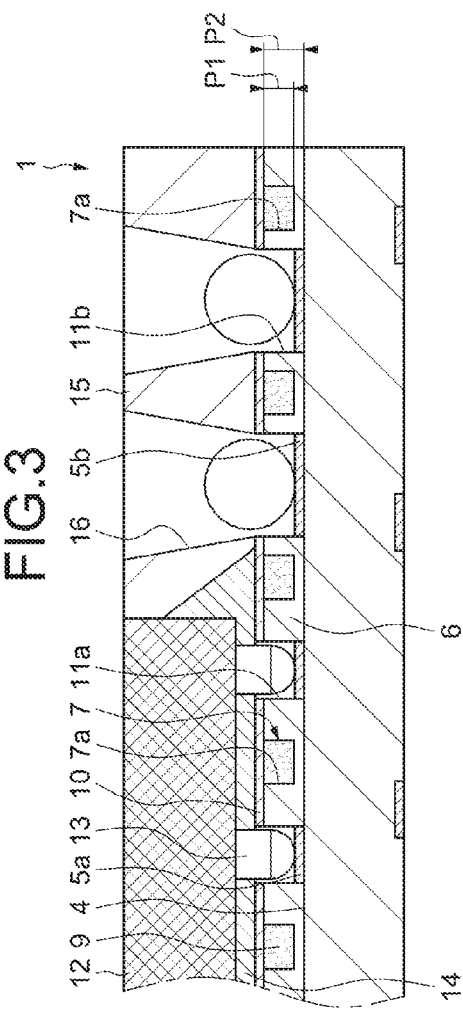
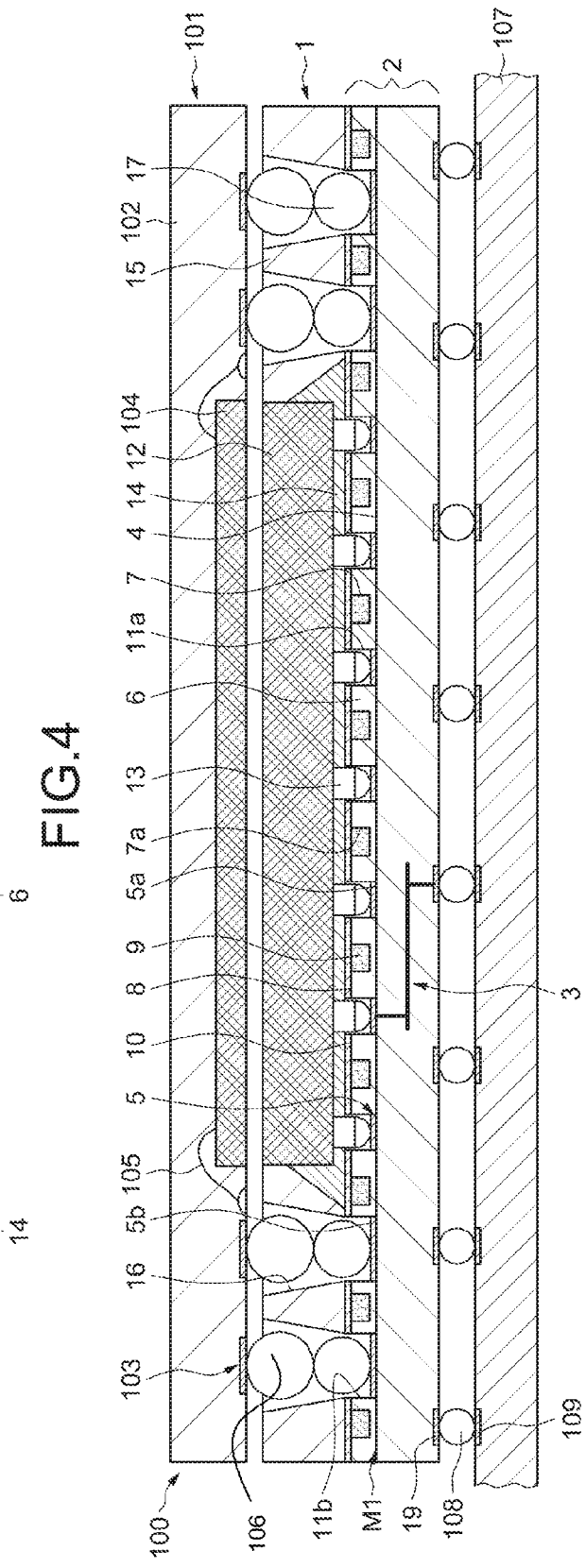

INTEGRATED CIRCUIT CHIP COMPRISING ELECTRONIC DEVICE AND ELECTRONIC SYSTEM

PRIORITY CLAIM

This application claims priority from French Application for Patent No. 1360008 filed Oct. 15, 2013, the disclosure of which is incorporated by reference.

TECHNICAL FIELD

The present invention relates to the field of microelectronics.

BACKGROUND

It is known to make electronic systems that comprise electronic devices stacked one on top of the other and electrically connected together, including at least one integrated circuit chip respectively.

Stacking electronic devices in particular has the advantage of improving the performance of electrical connections and of reducing footprint. Nevertheless, in certain cases integrated circuit chips may produce heat and the heat produced may heat other integrated circuit chips and thus degrade the performance of the latter. This is especially the case when a first electronic device comprises a processor chip that produces heat, and a second electronic device stacked on the first comprises a memory chip, the operation of which in particular degrades when its temperature increases.

The above circumstances are an obstacle to increasing the performance of said electronic systems, such as in particular the speed at which they run programs. However, the situation that at the present time consists in making a compromise between the performance desired from said electronic systems and their footprint, is unsatisfactory, especially in the field of portable devices such as mobile phones.

SUMMARY

According to one embodiment, an electronic device is provided which comprises a substrate wafer made of an insulating material, which is equipped with an electrical connection network and which bears, on at least one side, at least one integrated circuit chip, and in which the substrate wafer contains at least one internal duct.

Said internal duct may contain a thermally conductive material.

Said internal duct may be arranged a distance away from the electrical connection network.

Said duct may be arranged in the substrate wafer and take the form of a groove, and the substrate wafer may comprise a superficial layer covering this groove.

The substrate wafer may contain complementary internal ducts connected to said internal duct and connected to means for making a fluid flow.

The electrical connection network may comprise, on an internal plane, a metal level including electrical connection pads, and the substrate wafer may comprise, on this internal plane, an intermediate layer covered by said superficial layer and in which said groove is arranged, the intermediate layer and said superficial layer containing apertures above electrical connection pads, and said groove lying a distance away from these apertures.

The depth of said groove may be smaller than the depth of the frontal side of the metal level.

Said electrical connection network may comprise, in said metal level, electrical connection pads connected to the chip by intermediate electrical connection elements and electrical connection pads located around the chip, and, on the other side of the substrate wafer, electrical connection pads.

An electronic system is also provided, which comprises the above electronic device, and which comprises another electronic device placed on said electronic device and comprising another wafer equipped with another electrical connection network connected to said electrical connection network and bearing at least one other integrated circuit chip connected to this other electrical connection network.

Said system may comprise a printed circuit board bearing said electronic device by way of external metal elements connected to said electrical connection network.

BRIEF DESCRIPTION OF THE DRAWINGS

Electronic devices and electronic systems, according to particular embodiments of the present invention, will now be described by way of nonlimiting examples, these devices and systems being illustrated by the drawings, in which:

FIG. 3 shows an enlarged partial cross section of the electronic device in FIG. 1; and FIG. 4 shows an electronic system including the electronic device in FIG. 1.

DETAILED DESCRIPTION OF THE DRAWINGS

Figure 1:
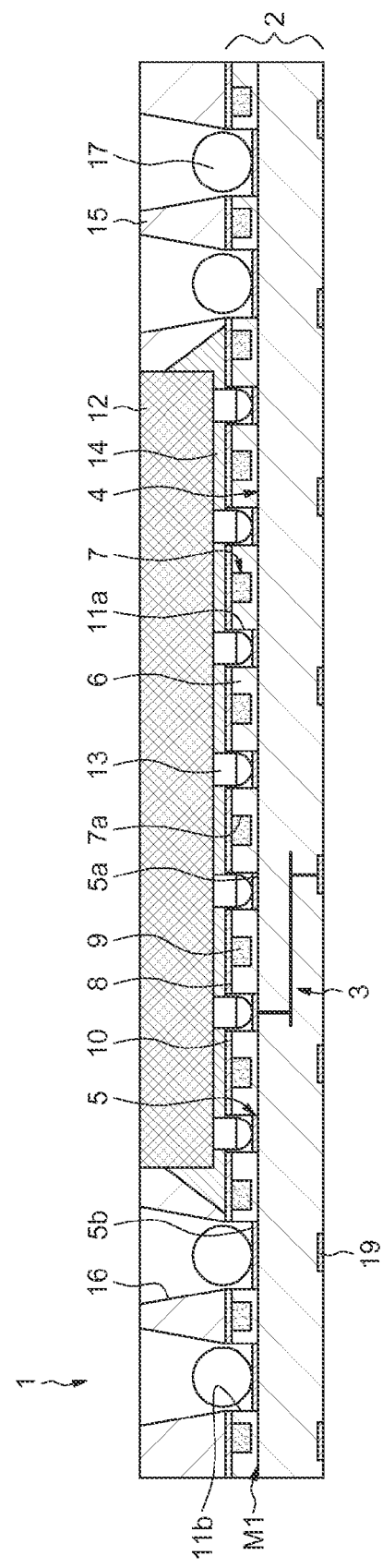
FIG. 1 shows a cross section of an electronic device.

As illustrated in FIG. 1, an electronic device 1 comprises a substrate wafer 2 made of an insulating material, which wafer 2 is equipped with an integrated metal electrical connection network 3 connecting one side to the other.

The electrical connection network 3 comprises a metal level M1 formed on an internal back plane 4 of the substrate wafer 2 and comprising a plurality of electrical connection pads and/or lines 5 comprising a matrix of electrical connection pads 5a arranged on a central zone of the plane 4 and a matrix of electrical connection pads 5b arranged on a zone encircling this central zone.

The substrate wafer 2 comprises an intermediate layer 6 formed on the plane 4 and covering the metal level 5.

In the intermediate layer 6, the substrate wafer 2 contains grooves 7a extending depthwise from the surface 8 of this layer 6. These grooves 7a are formed in locations not passing above electrical connection pads 5a and 5b.

The substrate wafer 2 furthermore comprises a superficial layer 10 formed on the surface 8 of the layer 6 and covering the grooves 7a so as to provide internal ducts 7 formed in the substrate wafer 2.

The internal ducts 7 are filled with a thermally conductive or heat transfer fluid 9. By way of heat transfer fluid, those sold under the trade mark Galden HT may be used.

According to a variant embodiment, the thermally conductive fluid 9 may be injected, using a syringe, through the superficial layer 10, a conduit being provided through the superficial layer 10 in order to allow this filling operation to be carried out. The hole left by the syringe and this conduit may then be blocked by virtue of beads of adhesive.

The layer 6 and the superficial layer 10 contain apertures 11a and 11b at least partially exposing the electrical connection pads 5a and 5b, respectively.

The electronic device 1 furthermore comprises an integrated circuit chip 12 placed on the substrate wafer 2 on the same side as the superficial layer 10, and comprises metal electrical connection elements 13, for example taking the form of columns, engaged in the apertures 11a and interposed between the chip 12 and the electrical connection pads 5a so as to connect the chip 12 and the electrical connection network 3.

The electronic device 1 also comprises an insulating encapsulation material 14 filling the space between the chip 12 and the substrate wafer 2. Optionally, the electronic device 1 may comprise a layer 15 made of an insulating material on the frontal side of the substrate wafer 2 and encircling the chip 12. For example, this layer 15 is flush with the frontal back side of the chip 12.

In the layer 15, apertures are arranged 16 exposing the apertures 11b of the layers 6 and 10. Electrical connection elements 17 such as bumps may be placed on the electrical connection pads 11a and in the holes formed by the apertures 11b and 16.

Figure 2:
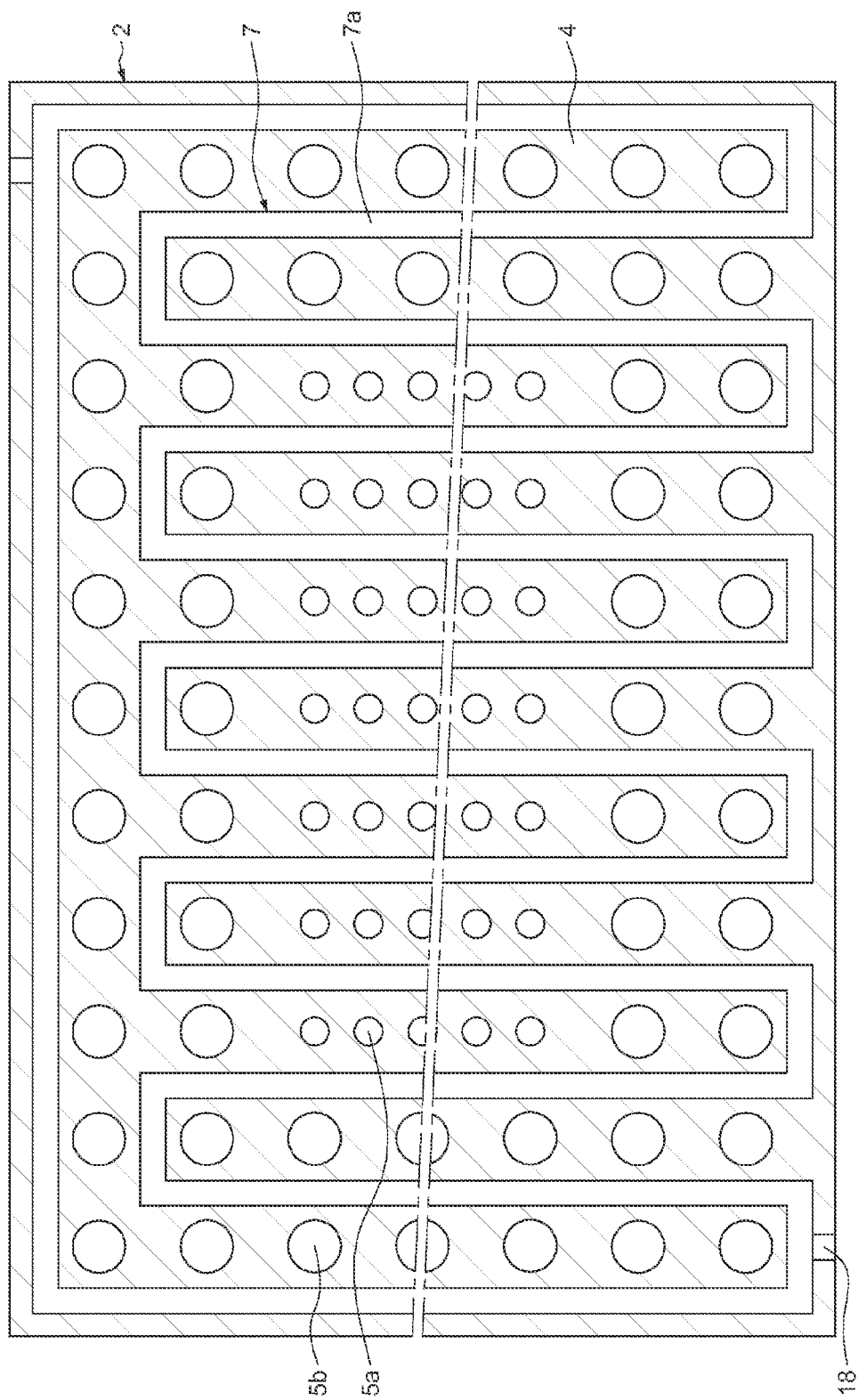
FIG. 2 shows a top view of the electronic device in FIG. 1 without its superficial layer.

As illustrated in FIG. 2, the ducts 7 may be arranged so as to lie between the rows of the matrices of electrical connection pads 5a and 5b and peripherally, thereby forming a closed circuit. Other arrangements are possible. In particular, more than one closed-circuit duct could be provided.

According to one variant embodiment, illustrated in FIG. 2, the ducts 7 may be connected to complementary ducts 18, for example supply/return ducts, arranged in the layer 6 of the substrate wafer 2, these ducts 18 emerging laterally from the substrate wafer 2 and possibly being connected to external means suitable for making a cooling fluid 9 flow.

According to another variant embodiment, the electronic device 1 may be equipped with a component incorporating a micropump, which component may be fixed to one of the sides of the device, for example by bonding, this micropump being connected to the internal ducts 7, for example at two remote locations, through the superficial layer 10, in order to make the heat transfer fluid 9 flow through these internal ducts 7.

As illustrated in FIG. 3, the depth P1 of the grooves 7a is smaller than the depth P2 of the frontal side of the metal level M1, such that the grooves 7a may be arranged so as to pass above electrical connection lines of the metal level M1 without exposing them.

According to one embodiment, the integrated circuit chip 12, which may be a processor chip, may generate heat. At least some of this generated heat may be preferentially captured by the material 9 filling the internal ducts 7 and dispersed to substantially the entire volume of the substrate wafer 2, i.e. both to the zone of the chip 12 and to the peripheral zone of the latter. Thus, the thermally conductive material 9 forms a means of capturing and dispersing to the bulk of the substrate wafer 2, at least some of the heat produced by the chip 12.

As illustrated in FIG. 4, the electronic device 1 may be included in an electronic system 100 furthermore comprising another electronic device 101 stacked a distance above the electronic device 1, on the same side as the chip 12.

The electronic device 101 may comprise, borne by a wafer 102 made of an insulating material and equipped with an electrical connection network 103, an integrated circuit chip 104 electrically connected to the electrical connection network 103 by electrical connection wires 105 embedded in the wafer 102.

The electronic device 101 is mounted on the electronic device 1 by way of electrical connection elements 106 such as metal bumps, which elements 106 are interposed between said devices, and electrically and selectively connect the electrical connection network 103 of the electronic device 101 to the electrical connection network 3 of the electronic device 1 by being soldered to electrical connection elements 17 placed on the pads 5b.

Furthermore, the electronic device 1 and therefore the electronic system 100, are mounted on a printed circuit board 107 by way of electrical connection elements 108, such as metal bumps, interposed between electrical connection pads 19 of the electrical connection network 3 and electrical connection pads 109 of the printed circuit board 107.

The arrangement described above by way of example has the following advantages.

The heat produced by the chip 4 and, as described above, transferred and dispersed to the substrate wafer 2 by virtue of the existence of the ducts 7 and the material 9 that they contain, may be transferred, at least partially, to the printed circuit board 107 by way of the electrical connection elements 108.

The electrical connection network 3 of the substrate wafer 2 participates in the transfer of the heat produced by the chip 12 to the printed circuit board 107.

Furthermore, the heat produced by the chip 4 also diffuses into the space separating the electronic device 1 and the electronic device 101, in order to be evacuated toward the exterior.

In so far as the material 9 is made to flow through the ducts 7 by external means by way of the complementary ducts 18, the heat produced by the chip 4 may thus be at least partially evacuated by this means.

Thus, the chip 12 is cooled and diffusion of the heat produced by the chip 12 of the electronic device 1 in the direction of the chip 104 of the electronic device 101 is limited in such a way that the chip 104 is protected from any excessive increase in its temperature.

The present invention is not limited to the examples described above. Many variant embodiments of the electronic devices and the heat transfer and cooling means are possible without departing from the scope of the invention.

What is claimed is:

1. An electronic device, comprising:
    a substrate wafer made of an insulating material and including an electrical connection network;
    wherein the electrical connection network comprises a metal level on a plane including electrical connection pads;
    an integrated circuit chip mounted on a top side of the substrate wafer; and
    wherein the substrate wafer comprises at least one internal duct formed in the substrate wafer by a groove which is covered by a superficial layer; and
    an intermediate layer on said plane and which is covered by said superficial layer;
    wherein said groove is formed in the intermediate layer, the intermediate layer and said superficial layer containing apertures above electrical connection pads, and said groove separated by a distance from said apertures; and
    wherein a depth of said groove is smaller than a depth of the intermediate layer.

2. The device according to claim 1, wherein said internal duct contains a thermally conductive material.

3. The device according to claim 1, wherein said internal duct is separated by a distance from the electrical connection network.

4. The device according to claim 1, wherein the substrate wafer further contains complementary internal ducts connected to said internal duct and configured for connection to means for making a fluid flow.

5. The device according to claim 1, wherein the groove extends to a depth which does not reach a front side of the metal level.

6. The device according to claim 1, wherein said electrical connection network comprises, in said metal level, electrical connection pads connected to the chip by intermediate electrical connection elements and electrical connection pads located around the chip, and, on the other side of the substrate wafer, electrical connection pads.

7. The device according to claim 1, further comprising another wafer having another electrical connection network that is connected to said electrical connection network and another integrated circuit chip connected to this other electrical connection network.

8. The device according to claim 7, further comprising a printed circuit board to which the substrate wafer is mounted by way of external metal elements connected to said electrical connection network.

9. An electronic device, comprising:
an integrated circuit including a surface with connecting elements; and
a substrate wafer including:
an insulating material layer including an electrical connection network;
a metal level including electrical connection pads on a top surface of the insulating material layer and in electrical contact with the electrical connection network;
an intermediate layer over the metal layer and the insulating material layer;
a plurality of trenches formed in a top surface of the intermediate layer;
a plurality of openings formed in the top surface of the intermediate layer and positioned between said trenches; and
a superficial layer on a top surface of the intermediate layer and configured to close said trenches to form at least one internal duct;
wherein said surface of said integrated circuit is mounted to the substrate wafer with said connecting elements extending into said openings.

10. The device of claim 9, further including a thermally conductive material contained within the internal ducts.

11. The device of claim 10, wherein the thermally conductive material is a fluid.

12. The device of claim 11, further including complementary internal ducts formed in the substrate wafer in fluid communication with the internal ducts.

13. The device of claim 12, wherein the complementary internal ducts are configured for connection to means for making said fluid flow.

14. The device of claim 9, wherein the plurality of openings formed in the top surface of the intermediate layer expose the electrical connection pads of the metal layer, and wherein the connecting elements of said integrated circuit are electrically connected to the electrical connection pads through the openings.

15. The device of claim 14, wherein the openings are separated from the trenches.

16. The device of claim 14, wherein each opening extends completely through the superficial layer.

17. The device of claim 9, wherein a depth of the trenches is smaller than a depth of the intermediate layer.

18. The device of claim 9, wherein the plurality of trenches are connected together to form a serpentine path.

* * * * *